(12) United States Patent
Segawa et al.

(10) Patent No.: US 6,740,183 B1
(45) Date of Patent: May 25, 2004

(54) METHOD OF PRODUCING CERAMIC MULTI-LAYERED SUBSTRATE

(75) Inventors: Shigetoshi Segawa, Ehime (JP); Hiroshi Ochi, Ehime (JP); Yasuyuki Baba, Ehime (JP); Osamu Shiraishi, Ehime (JP); Masao Konishi, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/445,892

(22) PCT Filed: Apr. 19, 1999

(86) PCT No.: PCT/JP99/02079

§ 371 (c)(1),
(2), (4) Date: Apr. 24, 2000

(87) PCT Pub. No.: WO99/56510

PCT Pub. Date: Nov. 4, 1999

(30) Foreign Application Priority Data

Apr. 24, 1998 (JP) .............................. 10-114671

(51) Int. Cl.[7] .................. B32B 31/22; B32B 31/26
(52) U.S. Cl. .................. 156/89.11; 156/89.12; 156/154; 156/281
(58) Field of Search .................. 156/89.11, 89.12, 156/89.16, 153, 154, 289, 281

(56) References Cited

U.S. PATENT DOCUMENTS

| 4,517,774 A | * | 5/1985 | Dudding |
| 4,800,688 A | * | 1/1989 | Suzuki |
| 4,817,342 A | * | 4/1989 | Martin et al. |
| 4,896,464 A | * | 1/1990 | Kim et al. |
| 4,920,640 A | * | 5/1990 | Enloe et al. |
| 5,085,720 A | * | 2/1992 | Mikeska et al. ......... 156/89.14 |
| 5,130,067 A | * | 7/1992 | Flaitz et al. |
| 5,277,723 A | * | 1/1994 | Kodama et al. |
| 5,370,759 A | * | 12/1994 | Hakotani et al. ....... 156/289 X |
| 5,456,778 A | * | 10/1995 | Fukuta et al. |
| 5,708,570 A | * | 1/1998 | Polinski, Sr. |
| 5,814,366 A | * | 9/1998 | Fukuta et al. ......... 156/89.11 X |
| 5,827,114 A | * | 10/1998 | Yam et al. |
| 6,042,667 A | * | 3/2000 | Adachi et al. ........... 156/89.12 |
| 6,139,666 A | * | 10/2000 | Fasano et al. |
| 6,153,290 A | * | 11/2000 | Sunahara |
| 6,241,838 B1 | * | 6/2001 | Sakamoto et al. ... 156/89.12 X |

FOREIGN PATENT DOCUMENTS

| EP | 0 535 711 | * | 4/1993 |
| JP | 4-17392 | | 1/1992 |
| JP | 5-102666 | | 4/1993 |
| JP | 6-61649 | * | 3/1994 |
| JP | 6-125171 | * | 5/1994 |
| JP | 8-64968 | | 3/1996 |
| JP | 10-75060 | * | 3/1998 |
| JP | 10-218675 | * | 8/1998 |

OTHER PUBLICATIONS

Japanese search report for PCT/JP99/02079 dated Jul. 21, 1999.
English translation of Form PCT/ISA/210.

* cited by examiner

Primary Examiner—Melvin C. Mayes
(74) Attorney, Agent, or Firm—RatnerPrestia

(57) ABSTRACT

A method for manufacturing a multi-layered ceramic substrate which enables to remove a shrinkage suppression sheet without damaging the multi-layered substrate. The shrinkage suppression sheets are formed on both faces of unfired laminated green sheets, and then the laminated green sheets are fired. For removing the shrinkage suppression sheets on both faces of the multi-layered ceramic substrate 2 after sintering, water, ceramic powder, or water and ceramic powder mixture is sprayed together with compressed air.

10 Claims, 2 Drawing Sheets

METHOD OF PRODUCING CERAMIC MULTI-LAYERED SUBSTRATE

THIS APPLICATION IS A U.S. NATIONAL PHASE APPLICATION OF PCT INTERNATIONAL APPLICATION PCT/JP99/02079.

FIELD OF THE INVENTION

The present invention relates to the field of methods for manufacturing a multi-layered ceramic substrate used for electronic devices, and in particular to methods for manufacturing a non-shrinkable multi-layered substrate which greatly suppresses shrinkage of the substrate during firing.

BACKGROUND OF THE INVENTION

Normally, multi-layered ceramic substrates are manufactured using a method called the green sheet lamination method. In this method, green sheets, made by forming a slurry containing ceramic powder and organic binder into a sheet, are punched (for holes) and screen printed with conductive paste. These green sheets are stacked to the required number, press-heated to laminate the layers, and then fired.

The advantages of this method include the feasibility of fine pattern printing realized by the extremely flexible green sheet and good permeability to organic solvents, and good surface smoothness and air-tightness which allow the lamination of even up to several dozens of layers.

On the other hand, the main disadvantage is the difficulty in achieving dimensional accuracy. This is due to shrinkage of the ceramic substrate accompanied by sintering which occurs during firing. Inaccurate dimensions cause mismatching between components and conductive patterns, generating the serious problem of inability to mount semiconductor chips such as CSPs (chip size packages) and MCMs (multi-chip modules) with high accuracy.

As a result, recent developments have been focusing on a method for eliminating lateral shrinkage during firing. This method involves the formation of shrinkage suppression sheets, using the doctor blade method, containing a ceramic material such as alumina which does not sinter at the sintering temperature of green sheet. These sheets are disposed on both faces of the green sheet laminated body and fired. The sintered multi-layered ceramic substrate then shrinks only in the thickness direction and not in the lateral direction, enabling semiconductor chips to be mounted with much higher accuracy.

FIG. 2 shows the conventional method for manufacturing a multi-layered ceramic substrate 2. After firing the multi-layered ceramic substrate 2, shrinkage suppression sheets 1 on both faces of a multi-layered ceramic substrate are removed by rotating a dry rotary brush 3 at high speed, as illustrated in FIG. 2.

However, this conventional removal method may not be able to accurately control the amount of the shrinkage suppression sheet to be removed by simply changing the rotation speed of the rotary brush or the distance to the substrate, i.e., the strength of the brush polishing the substrate. For example, too slow brush rotation speed or insufficient polishing time causes uneven removal. The conductive pattern on the surface of the multi-layered substrate may be damaged if the revolution of the brush is too fast or polishing time is too long. As a result, the conductive pattern may be disconnected or short-circuited, resulting in a low yield rate. Furthermore, in the case of an irregularly-shaped substrate with a cavity A on the surface of the multi-layered substrate, as shown in FIG. 2, residue in the cavity A is not always successfully removed by the rotary brush 3.

SUMMARY OF THE INVENTION

A method for manufacturing a multi-layered ceramic substrate of the present invention involves spraying of water, ceramic powder, or a mixture of ceramic powder and water together with compressed air for removing a shrinkage suppression sheet from a green sheet laminated body containing low-temperature firing substrate material.

The fine controllability of this method, by changing the pressure of compressed air, enables the removal of the shrinkage suppression sheet completely without causing uneven removal even if a cavity exists in the substrate. In addition, the polishing capability improves by adding ceramic powder.

Furthermore, properties of the ceramic powder used to create the green sheet laminated body remain unchanged, even if the removed shrinkage suppression sheet material mixes with the ceramic powder, because the same material is used for the ceramic powder which is sprayed and as the main constituent of the shrinkage suppression sheet. Accordingly, sprayed ceramic powder can be collected for reuse in spraying, enabling this method to be applied to circulating continuous devices.

DESCRIPTION OF THE PREFERRED EMBODIMENT

Figure 1:
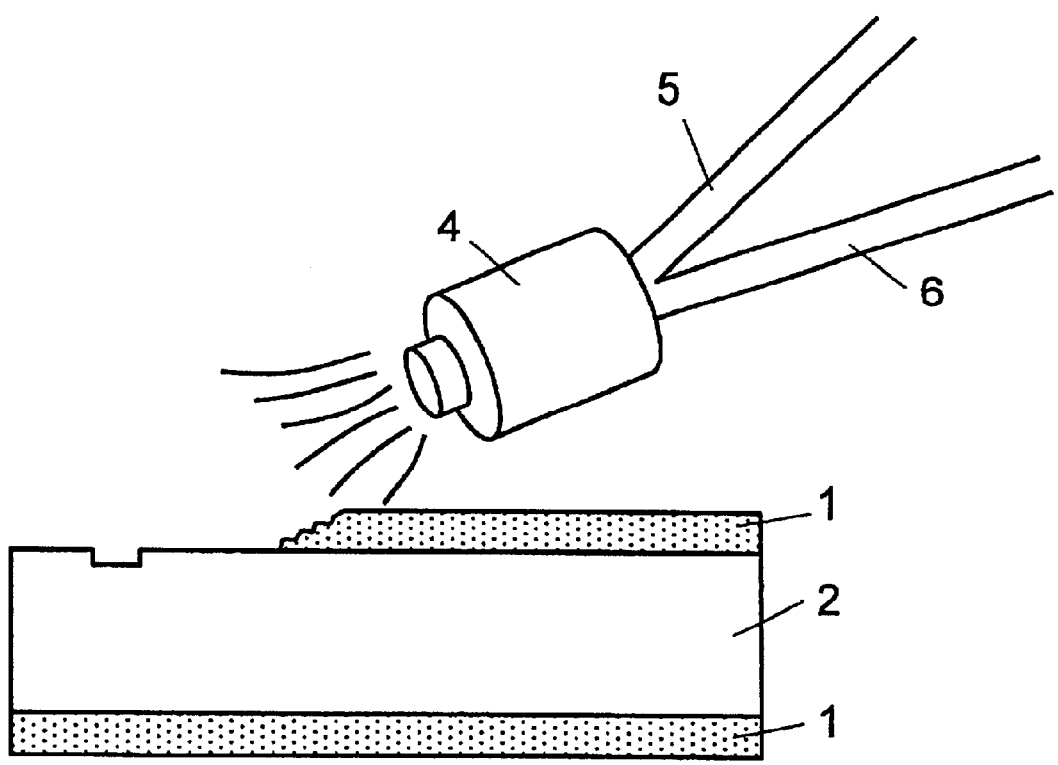
FIG. 1 is a side view depicting a method for manufacturing a multi-layered ceramic substrate in accordance with an exemplary embodiment of the present invention.
Figure 2:
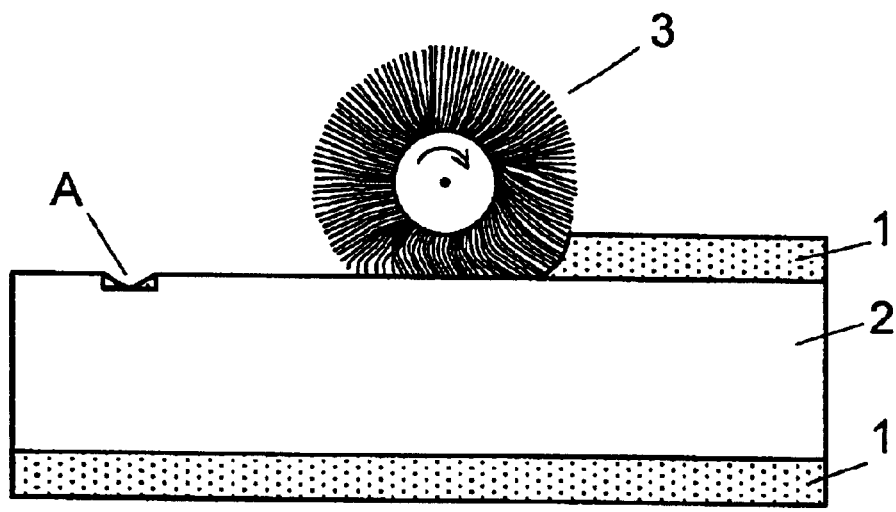
FIG. 2 is a side view depicting a method for manufacturing a multi-layered ceramic substrate of the prior art.

A first exemplary embodiment of the present invention is described with reference to FIG. 1. A green sheet laminated body 2 is an unfired multi-layered low-temperature firing substrate, before sintering, made typically of alumina and glass. Shrinkage suppression sheets 1 formed by the doctor blade method, are disposed on both faces of the green sheet laminated body 2. A material which does not sinter at the sintering temperature of the green sheet laminated body 2 is selected for the shrinkage suppression sheet 1. Typically, the shrinkage suppression sheet 1 is made of a ceramic material such as alumina. Then, the green sheet laminated body 2, on which the shrinkage suppression sheets 1 are formed on both faces, is fired.

After firing, the shrinkage suppression sheets 1 formed on both faces of the green sheet laminated body 2 are removed by spraying a mixture of water and alumina powder from a nozzle 4 connected to a feeding pipe for supplying water and alumina powder mixture 5 and a feeding pipe for supplying compressed air 6. The shrinkage suppression sheets 1 are thus removed by the injection pressure of water and alumina powder mixture.

Conditions for removing the shrinkage suppression sheet were studied, and two examples are described below. In the examples, a multi-layered ceramic substrate 2 of 115 mm×115 mm and a 200 μm thick shrinkage suppression sheet 1 made of alumina are used.

Table 1 shows the process conditions and the satisfactory results obtained by mixing 96 g of water and 4 g of alumina powder with a mean particle size of 0 to 10 μm, and spraying the mixture for about 100 to 400 seconds using compressed air at a pressure of 3.0 to 5.5 kg/cm$^2$.

In a second exemplary embodiment, Table 2 shows process conditions and the satisfactory results obtained by using only alumina powder with a mean particle size of 0.1 to 150 μm without using water, and spraying alumina powder for about 100 to 400 seconds using compressed air at a pressure of 3.0 to 5.5 kg/cm$^2$.

In these embodiments, the distance between the multi-layered ceramic substrate 2 and nozzle 4 was about 50 mm. After removal, the substrate was rinsed with deionized water at 120±5° C. for 15 minutes. Table 1 also shows a comparison of the results of the conventional manufacturing method and that of the present invention.

TABLE 1

|  | First Exemplary Embodiment (using water) | | | | | | prior art |
| --- | --- | --- | --- | --- | --- | --- | --- |
| Pressure (Kg/cm$^2$) | 5.3 | 3.5 | 3.5 | 3.5 | 3.5 | 3.5 | brush |
| use of water | yes | yes | Yes | yes | yes | yes | no |
| Particle size (μm) | 0 | 0.5 | 1.0 | 2.5 | 5.0 | 10 | — |
| Removal time (sec) | 400 | 300 | 200 | 150 | 100 | 100 | 500 |
| Uneven removal | no | no | No | no | no | no | yes |
| Damage to substrate | no | no | No | no | no | no | scratches by brush |
| Irregularly-shaped substrate | easy | easy | Easy | easy | easy | easy | difficult |

TABLE 2

|  | Secondary Exemplary Embodiment (without using water) | | | | |
| --- | --- | --- | --- | --- | --- |
| Pressure (Kg/cm$^2$) | 3.5 | 3.5 | 3.5 | 3.5 | 2.5 |
| use of water | no | no | no | No | no |
| Particle size (μm) | 0.1 | 10 | 50 | 100 | 150 |
| Removal time (sec) | 400 | 250 | 200 | 100 | 100 |
| Uneven removal | no | no | no | No | no |
| Damage to substrate | no | no | no | No | no |
| Irregularly-shaped substrate | easy | easy | easy | Easy | easy |

In a third exemplary embodiment of the present invention, the shrinkage suppression sheet may be removable by spraying just water without ceramic powder, combined with compressed air.

In the exemplary embodiments of the present invention it is preferable that the mean particle size of ceramic powder for removing the shrinkage suppression sheet 1 not exceed the range as shown in Tables 1 and 2, as cracks may occur on the surface of the ceramic substrate. Also, in the preferred embodiment the present invention it is preferred that the pressure of the compressed air not exceed the range as shown in Tables 1 and 2, it may take too much time for removing the shrinkage suppression sheet 1, or cause cracks on the substrate surface or breakage of the substrate.

In these exemplary embodiments, the green sheet laminated body 2 contains alumina, and the shrinkage suppression sheet 1 contains alumina powder. Accordingly, one advantage of the exemplary embodiments is that, after printing conductive resistance material and the like in the process after removing the shrinkage suppression sheet 1 impurities consisting of organic substances do not react with the printed materials and cause a detrimental effects on the laminated body when firing the green sheet laminated body 2. This is due to the use of inorganic alumina powder as a material for forming the shrinkage suppression sheet, which is the same material used in the ceramic powder used to form the green sheet laminated body 2. The conventional method removes the shrinkage suppression sheet 1 by means of a rapidly rotating brush. Therefore burning may occur on the surface of the green sheet laminated body 2 by organic substance in the brush, depending on the material of the brush. The remaining organic substance may cause detrimental effects to the laminated body when firing the green sheet laminated body 2 after removing the shrinkage suppression sheet 1.

Another advantage of the present invention enables the prevention of uneven removal or damage to the conductive pattern which occurs in the conventional method, and the reduction of operation time. Even for irregularly-shaped multi-layered substrate with cavities on its surface, the shrinkage suppression sheet may be removed completely. Polishing strength is finely controllable by adjusting the mixing ratio of spraying liquid, air pressure, time, and nozzle distance. In addition, the operation can be executed on both faces simultaneously by clamping the substrate.

Accordingly, shrinkage of the substrate during firing is suppressed to an extremely high degree, and a non-shrinkable multi-layered substrate can be reliably manufactured. This enables the mounting of components on multi-layered substrates without any mismatching between components and their respective conductive patterns, and also the mounting of semiconductor chips such as CSPs (chip size packages) and MCMs (multi-chip modules) with high accuracy, making high density mounting feasible.

Furthermore, the use of the same material for the ceramic powder to be sprayed, and as the main constituent of shrinkage suppression sheet, allows the collecting of sprayed ceramic powder for reuse in spraying, enabling this method to be applied to circulating continuous devices.

What is claimed is:

1. A method for manufacturing a multi-layered ceramic substrate with at least one cavity, said method comprising the steps of:

forming a shrinkage suppression sheet comprising a ceramic material on at least one face of an unfired green sheet laminated body comprising said at least one cavity, said shrinkage suppression sheet covering said at least one cavity;

firing said green sheet laminated body on which said shrinkage suppression sheet is formed on the at least one face; and removing said shrinkage suppression sheet by spraying ceramic powder and water together with compressed air onto said shrinkage suppression sheet on the at least one face of said green sheet laminated body after firing;

wherein said ceramic powder comprises the same ceramic material as said shrinkage suppression sheet; and the mean particle size of the particles of said ceramic powder is not greater than 10 μm, and ratio of said ceramic powder and said water is 4:96 in weight.

2. The method for manufacturing a multi-layered ceramic substrate as defined in claim 1, wherein the shrinkage suppression sheet has a sintering temperature which is higher than a sintering temperature of said green sheet laminated body.

3. The method for manufacturing a multi-layer ceramic substrate as defined in claim 2, wherein said ceramic material is alumina.

4. The method for manufacturing a multi-layered ceramic substrate as defined in claim 1, wherein said compressed air has a pressure between 3.0 and 5.5 kg/cm$^2$.

5. The method for manufacturing a multi-layered ceramic substrate as defined in claim 1, wherein said shrinkage suppression sheet is formed on both faces of said unfired green sheet laminated body and said ceramic powder and water is sprayed together with said compressed air onto said shrinkage suppression sheet on both faces of said green sheet laminated body simultaneously after firing.

6. The method for manufacturing a multi-layer ceramic substrate as defined in claim 5, wherein said ceramic material is alumina.

7. The method for manufacturing a multi-layered ceramic substrate as defined in claim 1, wherein said ceramic powder is collected, after spraying, for reuse.

8. A method for manufacturing a multi-layered ceramic substrate with at least one cavity, said method comprising the steps of:

forming a shrinkage suppression sheet comprising a ceramic material on two faces of an unfired green sheet laminated body, one of said faces comprising said at least one cavity, said shrinkage suppression sheet covering said at least one cavity;

firing said green sheet laminated body; and removing said shrinkage suppression sheet by spraying a mixture of ceramic powder and water together with compressed air onto at least one of the two faces of said green sheet laminated body, after firing;

wherein said ceramic powder comprises the same ceramic material as said shrinkage suppression sheet; and the mean particle size of the particles of said ceramic powder is not greater than 10 μm, and ratio of said ceramic powder and said water is 4:96 in weight.

9. The method for manufacturing a multi-layered ceramic substrate as defined in claim 8, wherein the compressed air has a pressure between 3.0 and 5.5 kg/cm$^2$.

10. The method for manufacturing a multi-layer ceramic substrate as defined in claim 8, wherein said ceramic material is alumina.

* * * * *

UNITED STATES PATENT AND TRADEMARK OFFICE
CERTIFICATE OF CORRECTION

PATENT NO. : 6,740,183 B1
APPLICATION NO. : 09/445892
DATED : May 25, 2004
INVENTOR(S) : Segawa et al.

Page 1 of 1

It is certified that error appears in the above-identified patent and that said Letters Patent is hereby corrected as shown below:

Title page,

Item [57], ABSTRACT, Col. 2

Line 2, delete "to remove a" and insert --the removal of--.

Line 3, delete "sheet" and insert --sheets--.

Line 4, delete " sheets are" and insert --sheet is--.

Line 6, delete "For removing the shrinkage suppression sheets on both faces of the multi-layered ceramic substrate 2 after sintering, water" and insert --Water--.

Line 8, after "or" insert --a--.

Line 9, after "sprayed" insert --,--.

Line 10, after "air." insert --onto the shrinkage suppression sheets, on both faces of the multi-layered ceramic substrate, after sintering, to remove the shrinkage suppression sheets.--.

Signed and Sealed this

Seventeenth Day of October, 2006

JON W. DUDAS
*Director of the United States Patent and Trademark Office*